(12) United States Patent
Matschl et al.

(10) Patent No.: US 9,279,870 B2
(45) Date of Patent: Mar. 8, 2016

(54) MAGNETIC RESONANCE ANTENNA ARRANGEMENT AND MAGNETIC RESONANCE SYSTEM

(71) Applicant: SIEMENS AKTIENGESELLSCHAFT, München (DE)

(72) Inventors: Volker Matschl, Bamberg (DE); Juergen Nistler, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 461 days.

(21) Appl. No.: 13/683,456

(22) Filed: Nov. 21, 2012

(65) Prior Publication Data

US 2013/0127463 A1     May 23, 2013

(30) Foreign Application Priority Data

Nov. 23, 2011   (DE) .......................... 10 2011 086 964

(51) Int. Cl.
    *G01V 3/00*        (2006.01)
    *G01R 33/34*      (2006.01)
    (Continued)

(52) U.S. Cl.
    CPC ............ *G01R 33/34* (2013.01); *G01R 33/3453* (2013.01); *G01R 33/34076* (2013.01);
    (Continued)

(58) Field of Classification Search
    CPC ..................................................... G01R 33/34
    USPC ......................................................... 324/309
    See application file for complete search history.

(56) References Cited

U.S. PATENT DOCUMENTS 6,043,658 A     3/2000   Leussler
7,449,888 B1    11/2008   Malik et al.
(Continued)

FOREIGN PATENT DOCUMENTS

CN     1445558 A     10/2003
CN     1490633 A      4/2004
(Continued)

OTHER PUBLICATIONS

German Office Action dated Aug. 1, 2012 for corresponding German Patent Application No. DE 10 2011 086 964.6 with English translation.

(Continued)

*Primary Examiner* — Rodney Fuller
(74) *Attorney, Agent, or Firm* — Lempia Summerfield Katz LLC

(57) ABSTRACT

A magnetic resonance antenna arrangement includes at least one first antenna group including individually-controllable first antenna conductor loops and a second antenna group adjacent to the first antenna group. The second antenna group includes individually-controllable, longitudinal second antenna elements. The first antenna conductor loops essentially extend in a first extending surface and are disposed in the first extending surface in a first direction in a row behind one another. The longitudinal second antenna elements extend with the longitudinal axes transverse to the first direction disposed in parallel next to one another in a second extending surface that runs essentially in parallel to the first extending surface. Each of the second antenna elements are coupled at first and second end areas to a conductive element to form a second conductor loop with the conductive element. The second antenna elements are disposed to overlap an adjacent first antenna loop in each case.

19 Claims, 4 Drawing Sheets

(51) Int. Cl.
- *G01R 33/54* (2006.01)
- *G01R 33/345* (2006.01)
- *G01R 33/36* (2006.01)
- *G01R 33/28* (2006.01)
- *G01R 33/561* (2006.01)
- *G01R 33/565* (2006.01)

(52) U.S. Cl.
CPC .............. *G01R33/365* (2013.01); *G01R 33/54* (2013.01); *G01R 33/288* (2013.01); *G01R 33/5612* (2013.01); *G01R 33/5659* (2013.01)

(56) References Cited

U.S. PATENT DOCUMENTS

| | | | |
|---|---|---|---|
| 7,733,088 B2 * | 6/2010 | Cho et al. ................. | 324/318 |
| 8,742,760 B2 * | 6/2014 | Matschl et al. ............. | 324/318 |
| 2004/0124840 A1 | 7/2004 | Reykowski | |
| 2012/0280687 A1 * | 11/2012 | Popescu .................... | 324/318 |
| 2015/0002156 A1 * | 1/2015 | Leussler et al. ............ | 324/322 |

FOREIGN PATENT DOCUMENTS

| | | |
|---|---|---|
| CN | 1534305 A | 10/2004 |
| CN | 1010559558 A | 10/2007 |
| CN | 101169473 A | 4/2008 |
| DE | 102 44 172 A1 | 3/2004 |

OTHER PUBLICATIONS

Alagappan, V., et al. "A Degenerate Birdcage Coil for Parallel Excitation," Proc. Intl. Soc. Mag. Reson. in Med., vol. 15, p. 1028, 2007.

Alagappan, V., et al. "Degenerate Mode Band-Pass Birdcage Coil for Accelerated Parallel Excitation," Magentic Resonance in Medicine, vol. 57, p. 1148-1158, 2007.

Vaughan, JT., et al. "High frequency volume coils for clinical NMR imaging and spectroscopy," Magn Reson Med., vol. 32, pp. 206-218, 1994.

Chinese Office Action for Chinese Patent Application No. 201210475604.2, mailed Oct. 30, 2015, with English Translation.

* cited by examiner

MAGNETIC RESONANCE ANTENNA ARRANGEMENT AND MAGNETIC RESONANCE SYSTEM

This application claims the benefit of DE 10 2011 086 964.6, filed on Nov. 23, 2011, which is hereby incorporated by reference.

BACKGROUND

The present embodiments relate to a magnetic resonance antenna arrangement for a magnetic resonance system with at least one first antenna group including a plurality of individually-controllable first antenna conductor loops.

Magnetic resonance tomography involves a technique of obtaining images of the inside of the body of a living proband. In order to obtain an image with this method, the body or the part of the body of the patient or proband under examination is to be subjected to a static basic magnetic field ($B_0$ field) that is as homogeneous as possible. The basic magnetic field is created by a basic field magnet system of the magnetic resonance system. The basic magnetic field is overlaid during the magnetic resonance imaging with rapidly switched gradient fields for local encoding. The gradient fields are generated by gradient coils. High-frequency pulses of a defined field strength (e.g., the "$B_1$ field") are beamed (e.g., radiated) with high-frequency antennas into the object under examination. The nuclear resonance of the atoms in the object under examination are excited by the high-frequency pulses, such that the high-frequency pulses are deflected by an "excitation flip angle" from the position of equilibrium in parallel to the basic magnetic field. The nuclear resonances process around the direction of the basic magnetic field. The magnetic resonance signals generated thereby are received by high-frequency receive antennas. The magnetic resonance images of the object under examination are created based on the received magnetic resonance signals.

To send out the high-frequency pulses into a measurement space, in which the object under examination is located, and, if necessary, also to receive the magnetic resonance signals from the object under examination, the tomograph may have a high-frequency antenna permanently installed in the tomograph housing (e.g., a "whole-body antenna"). Typical structures for whole-body antennas are birdcage structures, transversal electromagnetic (TEM) antennas, and saddle coils.

With modern magnetic resonance systems (MR systems), for example, that operate with basic magnetic field strengths of 3 Tesla or more, the interaction of the object under examination or patient with the fields of the high-frequency antenna arrangements results in degradations in the image quality. Eddy currents that may occur in the body of the patient may be responsible for these. The degradation in the image quality takes the form of a spatial variation of the flip angle in the transmit phase or variations of the signal-to-noise ratio during receiving. In addition, with these types of high magnetic field strengths, the absorption of the transmit power of the high-frequency pulses in the object under examination (e.g., the specific absorption rate (SAR)) plays a greater part. Thus, some imaging sequences are restricted in quality by the strict limitation of the permitted power absorption. To resolve or reduce these problems, the previous usual simple circular polarized transmit antennas are no longer used, but antenna arrays are used instead. The antenna arrays include a plurality of individual antenna elements (e.g., elements controllable independently of one another), or antenna conductor loops. If a multichannel transmit system, with which the individual antenna elements or antenna conductor loops may have high-frequency pulses applied independently, is also used, in principle, the high-frequency excitation field and thus the spatial flip angle distribution may be selected in any given manner. This enables, for example, a reduction in the SAR load on the patient to also be achieved. Since with these types of systems several RF pulses are transmitted simultaneously in parallel, which then overlay each other in an intended manner, this technique is also referred to as "parallel transmission technique" (pTX), and the antenna arrays are referred to as "pTX" arrays. Such antenna arrays have been used for the receive coils in the local coils to be accommodated close to the object under examination. Thus, the signal-to-noise ratio may be improved during reception, and the imaging time may be reduced.

A major demand on the antenna arrangement for pTX arrays is a sufficient decoupling of the individual antenna elements or antenna conductor loops in order to achieve crosstalk and thus a possible mixing of the separate transmit channels. With antenna arrangements, of which the antenna elements are only disposed over the circumference of the measurement space embodied, for example, in a cylindrical shape (e.g., a "patient tunnel"), a number of practical options are known for decoupling such as, for example, an overlap of two adjacent antenna conductor loops along the circumference by a specific amount. However, sufficient decoupling of antenna elements in two directions (e.g., not only in the circumferential direction but also in the longitudinal direction (axial direction) of the patient tunnel of antenna arrangements disposed next to one another) is problematic. The methods previously known for receive antennas are unsuitable for antenna arrangements that are to be employed for transmission, since the preamplifier decouplings used in the receive area may not be applied to transmit antennas. pTX antenna arrangements having individually-controllable antenna elements or antenna conductor loops not only disposed next to one another in the circumferential direction but also in the axial direction may also be built. The individual antenna elements arranged in the circumferential direction essentially only allow a direct improvement of the excitation in a transversal plane (e.g., a plane perpendicular to the axial direction of the patient tunnel). Other planes are only able to be slightly influenced by this and, even then, only when higher power is provided, which once again is associated with greater SAR. To also be able to influence any other given planes within the measurement space, three-dimensional areas or rotated slices (e.g., in the optimum manner, independently-controllable antenna elements disposed next to one another) are thus also provided in the axial direction.

SUMMARY AND DESCRIPTION

The present embodiments may obviate one or more of the drawbacks or limitations in the related art. For example, a magnetic resonance antenna arrangement having independently-controllable antenna elements or antenna conductor loops arranged in two directions that are sufficiently electromagnetically decoupled from one another is provided.

One embodiment of a magnetic resonance antenna arrangement (e.g., an MR antenna arrangement) has at least one first antenna group including a plurality of individually-controllable first antenna conductor loops (e.g., as a specific form of antenna element). In addition, the MR antenna arrangement has a second antenna group adjacent to the first antenna group having a plurality of individually-controllable second antenna elements embodied longitudinally (e.g., in strip form).

In this arrangement, the first antenna conductor loops extend essentially in a first (imaginary) extending surface and are arranged, for example, in the first extending surface in a first direction in a row behind one another. The fact that the first antenna conductor loops extend essentially in the first extending surface is to be understood as the antenna surfaces circumscribed by the conductor tracks of the antenna conductor loops lying in this imagined extending surface, apart from possible small deviations, through the individual conductor tracks lying on top of or pressing on one another, for example.

The longitudinal second antenna elements lie with longitudinal axes of the longitudinal second antenna elements transverse (e.g., at right angles) to the first direction, disposed in parallel next to one another in a second (imaginary) extending surface that runs essentially parallel to the first extending surface. This provides that the first extending surface and the second extending surface, apart from small deviations, run parallel at a specific distance (e.g., of a few millimeters or more) above one another. The second antenna elements may at least form a further row that, for example, runs in parallel to the row of the first antenna conductor loops. The second antenna elements are coupled at a first end area and at a second end area (e.g., by capacitive elements) to a conducting element so that the second antenna elements each form a conductor loop to the conducting element that is at an angle (e.g., an angle essentially of 90° or a right angle) to the first extending surface. The second antenna elements are, for example, constructed as TEM antennas.

In one embodiment, the arrangement of the respective first and second antenna group is such that the second antenna elements, at least in one of the end areas, spatially overlap with an adjacent first antenna conductor loop. This overlap is selected so that the first antenna conductor loops of the first antenna group are decoupled in each case from the relevant antenna element (or thus from the second antenna conductor loop) of the second antenna group at least by a predetermined amount.

Through this arrangement of the antenna conductor loops of the first antenna group and the conductor loops of the second antenna group adjacent thereto, in a form in which the conductor loops are transverse (e.g., at right angles to one another), a sufficient electromagnetic decoupling may be achieved purely by the geometry. An additional active decoupling, as may be carried out with receive antennas in the pre-amplifiers, for example, is not necessary. In such cases, decouplings of better than −15 dB between the individual adjacent antenna conductor loops and antenna elements may be achieved at no great expense.

One embodiment of the magnetic resonance system may be embodied like a conventional MR system suitable for transmission of pTX pulses. For example, the MR system is to be a high-frequency supply device with a plurality of transmit channels in order to supply the individual antenna elements or antenna conductor loops with high-frequency signals independently of one another in each case, so that the transmit high-frequency fields are superimposed to form a desired overall high-frequency field. The MR system also has one embodiment of a magnetic resonance antenna arrangement that may be used for transmission of magnetic resonance excitation signals within the MR system. Because the individual antenna conductor loops or the antenna elements are used as the magnetic resonance antenna arrangement, the individual antenna conductor loops or antenna elements are embodied so that, with respect to the frequencies of the magnetic resonance excitation signals to be transmitted or the magnetic resonance signals to be received, the individual antenna conductor loops or the antenna elements are resonantly tuned. If necessary, the individual antenna conductor loops or the antenna elements may also be detuned in order to switch the individual antenna conductor loops or the antenna elements to inactive.

The description for one category may also be developed in a similar manner to the description of one of the other categories.

The main problem of decoupling in whole-body antennas is that the whole-body antennas may be permanently installed in the tomograph housing (e.g., scanner housing) of the magnetic resonance tomography system and may be built onto a support tube. Accordingly, the magnetic resonance antenna arrangement may also be embodied as a whole-body coil. Despite this, one embodiment of the magnetic resonance antenna arrangement may still be embodied as a local coil (e.g., a local coil that has an essentially cylindrical construction, such as a head coil).

For example, when the coil is built onto a support tube of the scanner, the first extending surface accordingly corresponds essentially to a cylinder jacket surface, and the first direction may run along the circumference of the cylinder, so that the first antenna conductor loops disposed in a row form an annular antenna structure around the circumference of the cylinder. "Essentially" may be such that this extending surface encloses a tube-like basic structure or a cylindrical structure in a basic shape, having changes in diameter along the cylindrical axis such as projections, indentations, waisted areas or at the edge, tapers. In this type of structure of the first antenna group with individual antenna conductor loops disposed along the circumference in a row next to one another, a type of birdcage structure is thus formed. Since the birdcage structure includes individually-controllable conductor loops, the structures are also referred to as a "degenerated birdcage antenna" (e.g., "DBC antenna" or "DBC").

For decoupling two adjacent conductor loops within such a DBC antenna, the conductor loops may overlap each other by a specific amount. In an alternative variant, two first antenna conductor loops directly adjacent in a row have a common conductor loop section with a capacitive element in order to decouple the adjacent conductor loops from one another. With regard to the conductor track structure, such a DBC antenna is constructed like a classical birdcage antenna with, for example, two end rings and antenna rods extending in parallel along the circumference between the end rings. Capacitive elements are located in each case between the antenna rods in the end rings. In addition, capacitive elements are also located in the antenna rods in a DBC for decoupling. A separate feed-in point is provided at one of the end rings at the capacitive elements between two antenna rods for each of the respective antenna conductor loops that are formed respectively by two adjacent antenna rods as well as by the antenna ring segments between the two adjacent antenna rods.

The second antenna elements are each coupled to a conducting element at a first end area and at a second end area in order to form a conductor loop together with the conducting element. In one embodiment, the second antenna elements are each coupled at the first end area and at the second area via capacitive elements to a, for example, common conducting surface of a high-frequency screen. The high-frequency screen, with whole-body antennas, for example, surrounds the complete antenna structure. The high-frequency screen may be embodied in a cylindrical shape and lies radially outside the magnetic resonance arrangement in order to screen the magnetic resonance arrangement from the gradient coil arrangement lying even further radially outwards. Stray radiation from the magnetic resonance antenna arrangement into the gradient coil arrangement and vice versa may be avoided or may be reduced to an acceptable level by the high-frequency screen.

The second conductor loops formed by the second antenna elements together with the conducting element (e.g., the conductor surface of the high-frequency screen) are each at an angle (e.g., at right angles) to the first extending surface. If this surface runs on a cylinder circumference, this provides that the conductor loops formed by the second antenna elements and, for example, the conductor surface of the high-frequency screen are disposed with the conductor loop planes (e.g., the planes in which the conductor loop runs) running radially outwards.

In order to exhibit an optimal transmit characteristic, the distance between the second antenna elements and the associated conducting element (e.g., the conductor surface of the high-frequency screen) may amount to at least 10 mm (e.g., at least 20 mm).

Such a longitudinal antenna element may, for example, have any given longitudinal shape (e.g., be embodied as a tube). In one embodiment, the shape involves broad conductor strips. Regardless of the concrete embodiment, the longitudinal antenna elements, at right angles to the longitudinal extent in the second extending surface, have a breadth of at least 5 mm (e.g., at least 20 mm).

It may be sufficient for the first antenna conductor loops of the first antenna group and the respective conductor loops of the second antenna elements adjacent to the individual antenna conductor loop to be transverse (e.g., essentially at right angles) to one another in order to achieve a sufficient decoupling of –15 dB. The decoupling is even better the further the respective antenna elements or antenna conductor loops are spaced apart from one another. A sufficient distance between the second antenna elements and the associated conductive element (e.g., the conductive surface of the high-frequency screen) is provided in order to have a sufficiently good transmit characteristic. This minimum distance between the second antenna elements and the high-frequency screen is thus connected with a structure in the form of a tunnel-type MR antenna array with a corresponding radial construction height. With whole-body antennas, however, the radial construction height may be kept as small as possible. Therefore, in one variant, the second antenna element is disposed in each case and coupled to a conductive element (e.g., the high-frequency screen), such that the second conductor loop and the adjacent first antenna conductor loop engage with each other like the links of the chain. The antenna conductor loops are to be essentially at right angles to one another. "Essentially at right angles" provides that the imaginary surfaces, in which the respective conductor loops run, apart from the usual tolerances, are at right angles to each other at the intersection point. If the first extending surface, in which the first antenna conductor loops extend, runs in the shape of a cylinder surface, this applies accordingly for the tangential surface at the first extending surface or the cylinder surface lying at the imagined intersection point or the imagined intersection line.

In one embodiment, the magnetic resonance antenna arrangement possesses a number of such antenna groups (e.g., at least three but may also include more than three first and second antenna groups), which are disposed alternating in an extent direction running transverse (e.g., at right-angles or in parallel at right angles) to the first direction. This extent direction corresponds, for a structure of the magnetic resonance antenna arrangement in the shape of the cylinder, to the direction of the axis. For example, first and second antenna groups are disposed alternately in the longitudinal cylinder direction.

For example, when the coil is constructed as a whole-body coil, the two respective antenna groups lying outside in the extent direction (e.g., especially in the axial direction of the patient tunnel) may be formed by first antenna groups. This takes account of the fact that the field of an antenna group that includes elements running longitudinally in the direction of the axis of the patient tunnel (e.g., in the axial direction) may decay more slowly than the field of a birdcage antenna or DBC antenna. To let the field decay as quickly as possible in the outer areas in the patient tunnel and also outside the patient tunnel and thus avoid unnecessary SAR loads, a structure, in which the second antenna group is essentially disposed only in the central area and a first antenna group is respectively disposed at the outer axial areas as a type of birdcage, is provided.

For example, for a structure of a whole-body antenna around a tubular-shaped patient tunnel with, for example, a diameter of 60 to 70 cm, in order to achieve a sufficiently good decoupling with simultaneously optimal transmit characteristic, the distance between two first antenna conductor loops following each other in the extent direction (e.g., the axial direction) may amount to at least 15 cm and/or a maximum of 20 cm. As an alternative or in addition, the distance between two second antenna elements following each other in the extent direction amounts to at least 10 cm and/or a maximum of 30 cm.

A length of the first antenna conductor loops in an extent direction running at right angles to the first direction (e.g., in the axial direction of the patient tunnel) may amount to 20 cm and/or a maximum of 30 cm. In one embodiment, the length lies in the range of 25 cm. As an alternative or in addition, the length of the second antenna elements in the extent direction may amount to at least 30 cm and/or maximum 40 cm (e.g., in the 35 cm range).

BRIEF DESCRIPTION OF THE DRAWINGS

The same components are provided with identical reference characters in the different figures, in which.

DETAILED DESCRIPTION OF THE DRAWINGS

Figure 1:
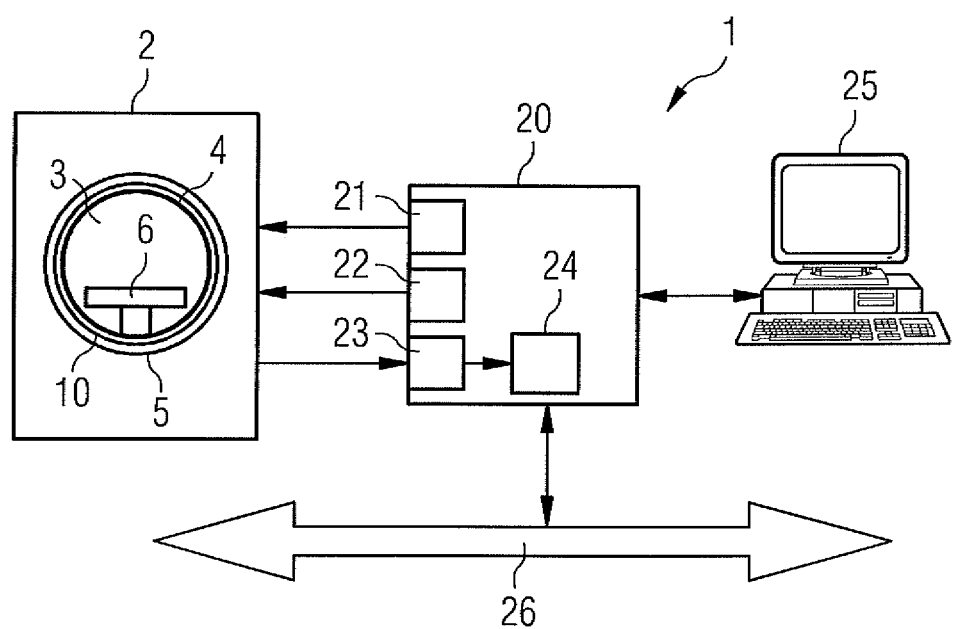
FIG. 1 shows one embodiment of a magnetic resonance system.

FIG. 1 shows a rough schematic diagram of an overview of one embodiment of a magnetic resonance system 1. The magnetic resonance system 1 includes a tomograph or scanner 2, in which a cylindrical measurement space 3 (e.g., the patient tunnel) is located. Disposed in the measurement space 3 is a generally mobile support plate 6 that may be moved out of the measurement space 3 in order to support a patient and position the patient in the measurement space 3 in a specific position.

The measurement space 3 is radially outwardly delimited by a support tube 4, on which one embodiment of a magnetic resonance antenna arrangement 10, which is described below in greater detail, is disposed. Located further radially outwards is a high-frequency screen 5 that screens the magnetic resonance antenna arrangement 10 from a gradient coil arrangement (not shown in the diagram) and the coils of the magnet system for generating a basic magnetic field that is as homogeneous as possible in the measurement space 3.

The tomograph 2 is controlled by a control device 20 that, for example, as well as many further components not shown in the diagram, includes a high-frequency transmit device 22 that applies high-frequency signals to the individual antenna elements or antenna conductor loops of the magnetic resonance antenna arrangement 10 independently of one another. As a result, a specific high-frequency field is sent out into the measurement space 3. The transmit device 22 includes a plurality of separate transmit channels.

Also shown in FIG. 1 is a block as a further interface 21 that is designed to symbolize overall that other components within the tomograph (e.g., the gradient coils, the basic field magnetic coils, the patient table) are controlled by the control device 20. Control for acquisition of magnetic resonance signals may be undertaken on the basis of control protocols predetermined and modifiable by an operator.

The magnetic resonance signals induced in the object under examination by the RF excitation are either received again with the magnetic resonance antenna arrangement 10 and/or with further antenna arrangements (e.g., local coils (not shown)) and are transferred to a magnetic resonance receive device 23 of the control device 20. At the magnetic resonance receive device 23, the signals (e.g., raw data) are preprocessed and forwarded in digital form to a reconstruction device 24 that constructs magnetic resonance images from the signals in the conventional manner. The magnetic resonance images may, for example, be stored in a memory and/or presented at a terminal 25, via which an operator may control the control device 20 and thus also the tomograph 2. The control device 20 is connected in the normal way to a network 26, via which raw data and/or completely reconstructed image data may be sent to other units (e.g., mass storage, diagnosis workstations, and/or printers), or data such as patient data or measurement logs, for example, may be received.

Figure 2:
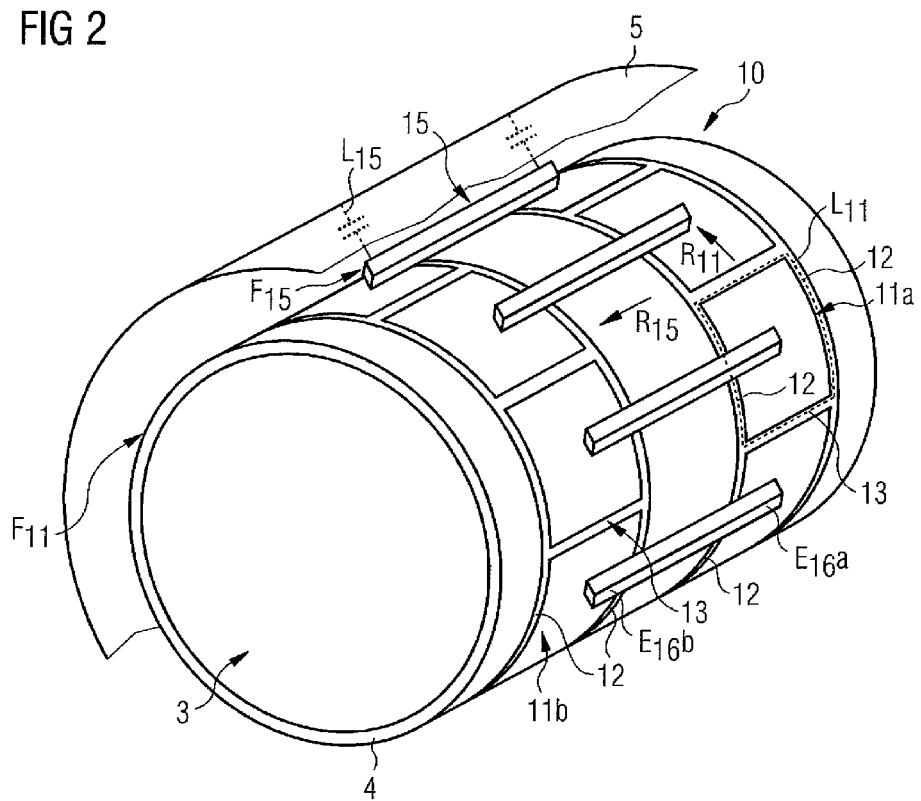
FIG. 2 shows a perspective view of one embodiment of a magnetic resonance antenna arrangement on a support tube.

FIG. 2 shows an exemplary embodiment of an MR antenna arrangement 10 on a support tube 4 around a patient tunnel 3, such as is used, for example, in the MR system 1 in accordance with FIG. 1.

This MR antenna arrangement 10 includes, for example, two first antenna groups 11a, 11b (e.g., DBC antenna groups 11a, 11b) that are each constructed in the form of a DBC antenna. The first two antenna groups 11a, 11b are disposed at an axial distance from one another in relation to the support tube 4. Located between the first two antenna groups 11a, 11b is a further, second antenna group 15 including a number of longitudinal antenna elements 16 that, on an end side, each overlap the two first antenna groups 11a, 11b. The second antenna group 15 (e.g., the TEM antenna group 15) involves a TEM antenna structure.

Figure 3:
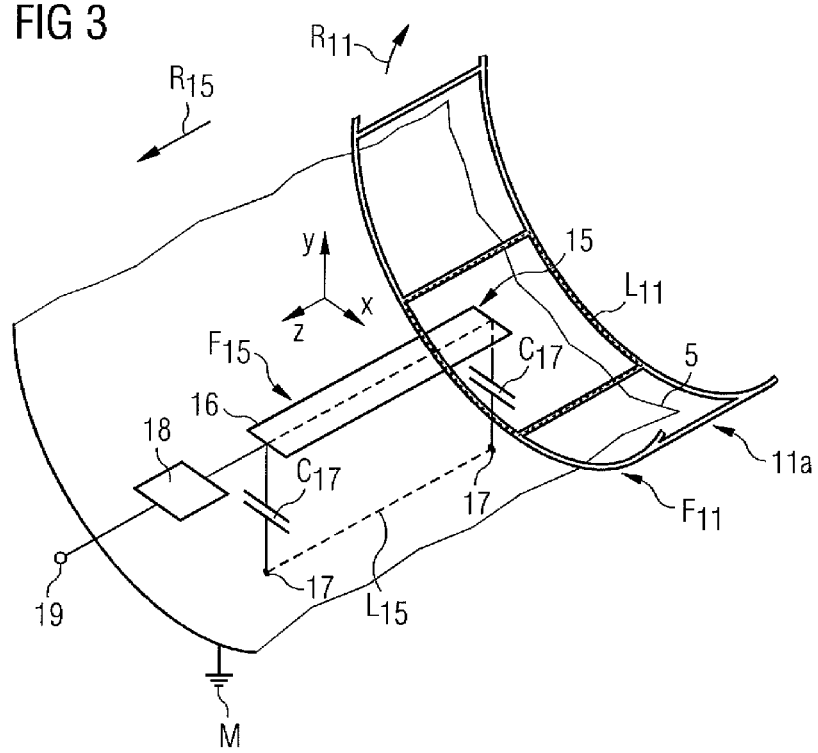
FIG. 3 shows a section of one embodiment of a magnetic resonance antenna arrangement.
Figure 4:
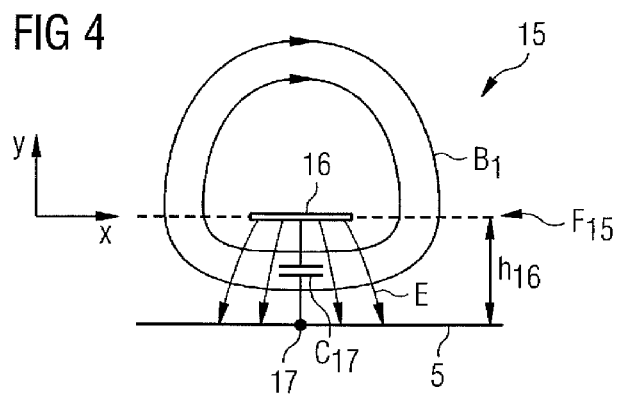
FIG. 4 shows an end face-side of an exemplary mode of operation of a second antenna element according to the magnetic resonance antenna arrangement of FIG. 3.
Figure 5:
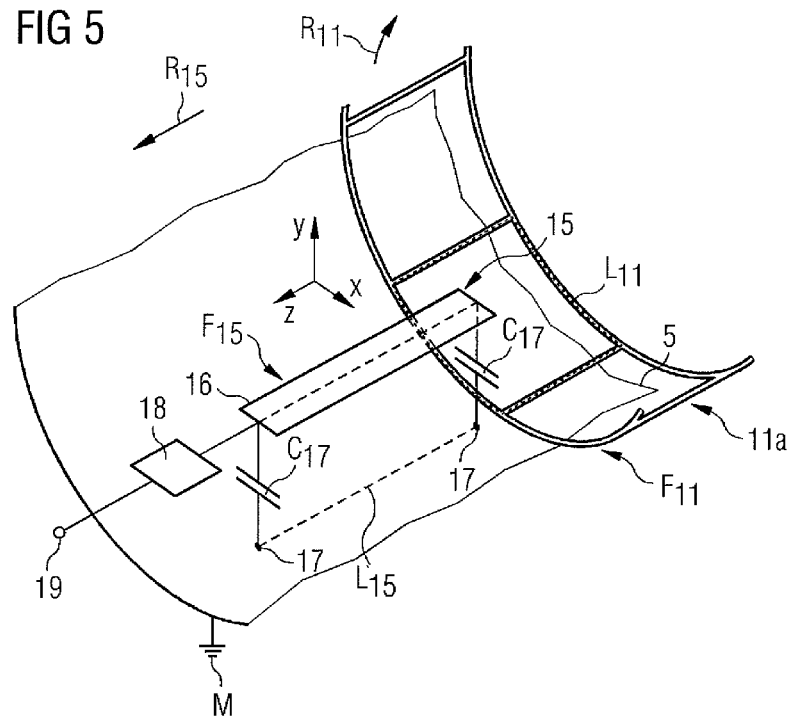
FIG. 5 shows a section of an embodiment of a magnetic resonance antenna arrangement.

The embodiments shown in FIGS. 3 to 5 differ from the structure depicted in FIG. 2 in that relatively thin conductor strips are employed as longitudinal antenna elements 16, where tubular antenna elements 16 are used in FIG. 2. The principal basic structure is the same, however.

Figure 6:
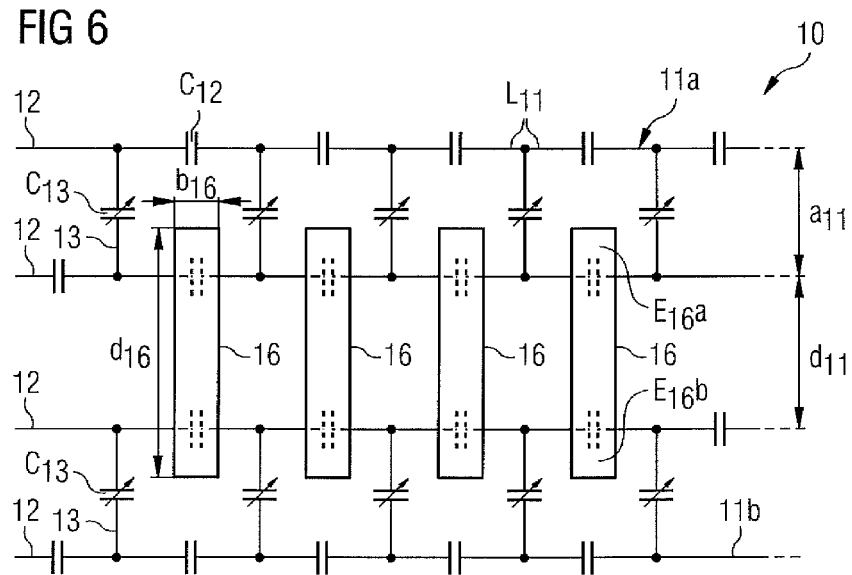
FIG. 6 shows an overhead view and a schematic unrolled view of an embodiment of a magnetic resonance antenna arrangement.

As shown in FIG. 2 and FIG. 6 (e.g., showing an unrolled view of the antenna structure from above), such a DBC antenna group 11a, 11b includes two end rings 12 running in a first extent direction (e.g., circumferential direction $R_{11}$), between which, in a second extent direction $R_{15}$, antenna rods 13 disposed running in parallel extend along the circumference (e.g., as in a classical birdcage antenna). Located in the end rings 12 between each two longitudinal antenna rods 13 is a capacitor $C_{12}$. Tunable capacitors $C_{13}$ are located in the antenna rods 13 of the DBC antenna groups 11a, 11b. Two such adjacent antenna rods 13 and the sections/segments of the end rings 12 lying between the two antenna rods 13, each form individual conductor loops $L_{11}$. The conductor loops $L_{11}$ each may have high-frequency pulses applied to the conductor loop $L_{11}$ through corresponding feed-in connections (not shown) that are disposed in the normal way on one of the capacitors $C_{12}$ for each of the conductor loops $L_{11}$. The decoupling of the adjacent antenna conductor loops $L_{11}$ within a DBC antenna group 11a, 11b is realized by the use of the common conductor section (e.g., the antenna rod 13) and the decoupling capacitor $C_{13}$ located in the common conductor section. In order to achieve an optimal decoupling, a frequency-dependent setting of the decoupling capacitors $C_{13}$ may be undertaken in accordance with the equation $$C_{13} = \frac{L}{f^2},$$

where L is the inductance of the common conductor of two adjacent conductor loops $L_{11}$ (e.g., of the antenna rod 13), and f is the desired magnetic resonance (e.g., Larmor frequency). A decoupling of two adjacent antenna conductor loops $L_{11}$ within the DBC antenna group 11a, 11b of −30 dB may be achieved.

The central TEM antenna group 15 along the support tube 4, as shown in FIGS. 2 to 6, has, in each case, longitudinal antenna elements 16 (e.g., TEM elements 16) that are connected via connections 17 to a conductive element (e.g., with the conductive surface of the high-frequency screen 5). Located in these connections 17 are suitable capacitors $C_{17}$, via which a decoupling of adjacent second TEM elements 16 from one another may be provided. In order, for example, to achieve a decoupling of adjacent TEM elements 16 of approximately 30 dB, capacitors in the order of magnitude of 1 to 4 pF may be selected. The high-frequency screen may be embodied in the usual manner (e.g., with a conductive surface that lies at ground potential M). In order to apply high-frequency signals to the TEM antenna elements 16, the TEM antenna elements 16 are connected on one side by an impedance matching circuit 18 to a feed-in connection 19 (see FIGS. 3 and 5). Instead of a connection with the high frequency screen, the TEM elements 15 may also each be connected to a conductor strip of the TEM element 15 as a conductive element that extends, for example, in a plane above or within the conductive surface of the high-frequency screen.

The functioning of such TEM elements 16 or of the high-frequency fields generated by the elements is shown schematically in FIG. 4. FIG. 4 shows how a TEM element 16 in the form of a simple conductor strip disposed in the second extending surface $F_{15}$ at a distance $h_{15}$ of, for example, 1 to 2 cm or more above the conductive surface of the high-frequency screen 5 is formed and is connected via a capacitive element $C_{17}$ to the conductive surface 5. A conductor loop $L_{15}$ is thus formed by the TEM element 16 jointly via the connections 17 and the section located under (see FIGS. 3 to 5) or over (see FIG. 2) the TEM element 16. The conductor loop $L_{15}$ or the plane that is spanned by the conductor loop $L_{15}$, is at right angles, for example, to the cylindrical first extending surface $F_{11}$.

The different extending surfaces $F_{11}$ and $F_{15}$ are shown in the schematic diagrams in FIG. 3 and FIG. 5. These figures show that the antenna conductor loops $L_{11}$ lie in the DBC antenna groups 11*a*, 11*b* in parallel below or above the surface $F_{15}$, in which the TEM elements 16 are disposed. The two extending surfaces $F_{11}$, $F_{15}$ thus lie in the cylindrical arrangement on different concentric outer surfaces around the support tube 4.

In this case, two variants are provided. In the first variant, as is shown in FIGS. 2 and 3, the first extending surface $F_{11}$ lies radially further inwards than the second extending surface $F_{15}$ (e.g., the DBC antenna groups 11*a*, 11*b* are disposed radially further inwards than the TEM antenna group 15). In order to save radial space, however, the second extending surface $F_{15}$ may lie radially further inwards than the first extending surface $F_{11}$. Since the TEM antenna elements 16, as shown, are, however, connected to the conductive surface of the high-frequency screen 5 that lies radially outside the MR antenna arrangement 10, this leads, as is depicted in FIG. 5, to the first antenna conductor loops $L_{11}$ of the birdcage antenna groups 11*a*, 11*b* being chained, respectively, to the conductor loops $L_{15}$ of the TEM antenna group. This enables radial space to be saved.

In all structures, the TEM antenna elements 16 are each disposed in end areas $E_{16}a$, $E_{16}b$ (see FIG. 6 from above) overlapping with an adjacent antenna conductor loop $L_{11}$ of the birdcage antenna groups 11*a*, 11*b*. This achieves a sufficient decoupling of −15 dB or even more in each case between the TEM antenna elements 16 and the directly adjacent antenna conductor loops $L_{11}$. The reason for this is that, as shown in FIG. 4, at each TEM element 16, the electrical fields E of the TEM element 16 run radially outwards to the high-frequency screen 5. The magnetic field line of the magnetic field $B_1$ accordingly runs in a circular shape around the longitudinal axis of the TEM element 16. The E fields of the TEM elements 16 and the E fields of the antenna conductor loops $L_{11}$ of the birdcage antenna group 11 thus each run essentially at right angles to each other.

It is thus provided overall with this structure that the adjacent antenna elements are decoupled from one another not only in the usual first extent direction $R_{11}$ running in the direction of the cylinder circumference, but also adjacent antenna elements adjoining each other or overlapping one another in the axial direction. Antenna elements lying diagonally (e.g., transverse adjacent antenna elements) may easily be coupled from one another solely as a result of the distance between the antenna elements with a suitable structure.

The exemplary embodiment shown in FIGS. 2 and 6 with a central TEM antenna group 15 and two axial outer DBC antenna groups 11*a*, 11*b* has the advantage that in the isocenter (e.g., in the radially innermost area of the patient tunnel), in which the field of view may lie, a relatively strong homogeneous $B_1$ field that decays relatively quickly outwards may be generated. The TEM antenna group 15 may be used as the main transmit antenna that generates the actual $B_1$ field, and the two outer DBC antenna groups 11*a*, 11*b* act as types of correction antennas that may also destructively overlay the field of the TEM antenna group 15 and make sure that the field decays as quickly as possible axially outwards, and the overall SAR load is reduced.

In one embodiment, both the TEM antenna group 15 and the DBC antenna groups 11*a*, 11*b* may not be chosen too short in the axial direction in order to achieve the highest possible efficiency and penetration depth. For a support tube diameter of approximately 60 to 70 cm and an axial distance $H_{16}$ of the TEM antenna elements 16 from the high-frequency screen 5 of approximately 2 cm, the following dimensions may be used for an optimal transmit characteristic and simultaneously sufficient decoupling of the antenna elements from one another. The axial length of the first antenna conductor loops $L_{11}$ of the DBC antenna groups 11*a*, 11*b* may be selected between 20 and 30 cm (e.g., at 25 cm). The axial length $A_{16}$ of the TEM antenna elements 16 may be 30 to 40 cm (e.g., 35 cm). The distance $D_{11}$ between the two DBC antenna groups 11*a*, 11*b* may be between 15 and 20 cm.

In this structure, the end areas $E_{16}a$, $E_{16}b$ of the TEM antenna elements 16 overlap the individual antenna conductor loops $L_{11}$ of the DBC antenna groups 11*a*, 11*b* in each case by up to around the middle of the antenna conductor loops $L_{11}$.

With all these dimensions, a decoupling of at least −15 dB is achieved between all antenna groups without additional measures. If, with the aforesaid exemplary embodiment, it is assumed that the DBC antenna groups 11*a*, 11*b* each have eight radial part segments (e.g., eight individual antenna conductor loops $L_{11}$) and, accordingly, eight parallel TEM antenna elements 16 are also used in the TEM antenna group 15, then there is an element spacing of 23 to 27 cm between the TEM antenna elements 16 for a diameter of the support tube of approximately 60 to 70 cm. A decoupling of adjacent TEM antenna elements 16 of −15 dB is achieved without additional decoupling measures.

To enable the individual antenna elements 15 or antenna conductor loops $L_{11}$ to be controlled separately, as stated, each of the antenna elements 15 or antenna conductor loops $L_{11}$ is provided with a corresponding feed-in circuit. In one embodiment, each antenna element 15 or each antenna conductor loop $L_{11}$ also has detuning circuits for deactivation in order to also be able to work with local coils if necessary. The feed into the individual antenna elements or antenna conductor loops is performed in each case via, for example, a coaxial cable that may be connected to the RF screening in order to already largely suppress sheath currents in this way.

The magnetic resonance antenna arrangement thus provides an antenna structure with individually-controllable antenna elements in the longitudinal and circumferential direction that may be used in the optimum manner for any given pTX method to homogenize $B_1$ fields or flip angles and to reduce the SAR load. All antenna elements or antenna conductor loops are sufficiently decoupled in order to enable the amplifier power for sending out a desired high-frequency field to be kept as low as possible. This good decoupling thus also provides that lower-cost high-frequency transmission systems may be used.

The method described above, as well as the magnetic resonance systems or antenna systems presented, merely involve exemplary embodiments that may be modified by the person skilled in the art in a wide variety of ways without departing from the field of the invention as specified by the claims. For example, this does not preclude the magnetic resonance antenna arrangement being constructed in another surface shape (e.g., not in a tunnel shape). The different antenna structures may also be combined. The use of the indefinite article "a" or "an" does not preclude the features concerned also being present a number of times.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance antenna arrangement comprising:
   at least one first antenna group comprising a plurality of first antenna conductor loops, the plurality of first antenna conductor loops being individually-controllable; and
   a second antenna group adjacent to the at least one first antenna group, the second antenna group comprising a plurality of longitudinal second antenna elements, the plurality of longitudinal second antenna elements being individually-controllable,
   wherein the plurality of first antenna conductor loops essentially extend in a first extending surface and are arranged in the first extending surface in a first direction in a row behind one another,
   wherein the plurality of longitudinal second antenna elements are disposed with longitudinal axes transverse to the first direction in parallel next to one another and extend in a second extending surface that runs essentially in parallel to the first extending surface,
   wherein the plurality of longitudinal second antenna elements are coupled at a first end area and at a second end area to a conductive element such that each longitudinal second antenna element of the plurality of longitudinal second antenna elements forms a second conductor loop with the conductive element, which is at an angle to the first extending surface, and
   wherein the plurality of longitudinal second antenna elements are disposed so that, in the first end area, the second end area, or the first end area and the second end area, each longitudinal second antenna element of the plurality of longitudinal second antenna elements overlaps with an adjacent first antenna conductor loop of the plurality of first antenna conductor loops.

2. The magnetic resonance antenna arrangement as claimed in claim 1, wherein the first extending surface essentially forms a cylinder outer surface, and the first direction runs along the circumference of a cylinder formed by the cylinder outer surface, so that the plurality of first antenna conductor loops are arranged in a row form an annular antenna structure.

3. The magnetic resonance antenna arrangement as claimed in claim 1, wherein two first antenna conductor loops of the plurality of first antenna conductor loops next to one another in a row have a common conductor loop section with a capacitive element.

4. The magnetic resonance antenna arrangement as claimed in claim 1, wherein the plurality of longitudinal second antenna elements are each coupled at the first end area and at the second end area to a conductive surface of a high-frequency screen.

5. The magnetic resonance antenna arrangement as claimed in claim 1, wherein a distance between the plurality of longitudinal second antenna elements and the conductive element is at least 10 mm.

6. The magnetic resonance antenna arrangement as claimed in claim 5, wherein the distance is at least 20 mm.

7. The magnetic resonance antenna arrangement as claimed in claim 1, wherein each longitudinal second antenna element of the plurality of longitudinal second antenna elements has a width at right angles to a longitudinal extent of at least 5 mm.

8. The magnetic resonance antenna arrangement as claimed in claim 7, wherein the width is at least 20 mm.

9. The magnetic resonance antenna arrangement as claimed in claim 1, wherein a longitudinal second antenna element of the plurality of longitudinal second antenna elements is disposed and coupled to the conductive element such that the second conductor loop and the adjacent first antenna conductor loop engage into one another as links in a chain.

10. The magnetic resonance antenna arrangement as claimed in claim 1, further comprising at least three first and second antenna groups disposed alternating and in an extent direction running transverse to the first direction, the at least three first and second antenna groups comprising the at least one first antenna group and the second antenna group.

11. The magnetic resonance antenna arrangement as claimed in claim 10, wherein two antenna groups lying on the outside in an extent direction of the at least three first and second antenna groups are formed by first antenna groups, the at least one first antenna group comprising the first antenna group.

12. The magnetic resonance antenna arrangement as claimed in claim 10, wherein a distance between two first antenna conductor loops of the plurality of first antenna conductor loops following each other in an extent direction amounts to at least 15 cm, a maximum of 20 cm, or at least 15 cm and a maximum of 20 cm, a distance between two longitudinal second antenna elements of the plurality of longitudinal second antenna elements following each other in the extent direction amounts to at least 12 cm, a maximum of 30 cm, or at least 12 cm and a maximum of 30 cm, or a combination thereof.

13. The magnetic resonance antenna arrangement as claimed in claim 1, wherein a length of the plurality of first antenna conductor loops in an extent direction running at right angles to the first direction is at least 20 cm, is a maximum of 30 cm, or is at least 20 cm and is a maximum of 30 cm, a length of the plurality of longitudinal second antenna elements in the extent direction is at least 30 cm, is a maximum of 40 cm, or is at least 30 cm and is a maximum of 40 cm, or a combination thereof.

14. The magnetic resonance antenna arrangement as claimed in claim 13, wherein the length of the plurality of first antenna conductor loops in the extent direction running at right angles to the first direction is 25 cm, and
   wherein the length of the plurality of longitudinal second antenna elements in the extent direction is 35 cm.

15. The magnetic resonance antenna arrangement as claimed in claim 1, wherein the magnetic resonance antenna arrangement is a whole-body coil.

16. A magnetic resonance system comprising:
   a magnetic resonance antenna arrangement operable to generate magnetic resonance images of an object under examination, the magnetic antenna arrangement comprising:
      at least one first antenna group comprising a plurality of first antenna conductor loops, the plurality of first antenna conductor loops being individually-controllable; and
      a second antenna group adjacent to the at least one first antenna group, the second antenna group comprising a plurality of longitudinal second antenna elements, the plurality of longitudinal second antenna elements being individually-controllable,
      wherein the plurality of first antenna conductor loops essentially extend in a first extending surface and are arranged in the first extending surface in a first direction in a row behind one another, wherein the plurality of longitudinal second antenna elements are disposed with longitudinal axes transverse to the first direction in parallel next to one another and extend in a second extending surface that runs essentially in parallel to the first extending surface, wherein the plurality of longitudinal second antenna elements are coupled at a first end area and at a second end area to a conductive element such that each longitudinal second antenna element of the plurality of longitudinal second antenna elements forms a second conductor loop with the conductive element, which is at an angle to the first extending surface, and wherein the plurality of longitudinal second antenna elements are disposed so that, in the first end area, the second end area, or the first end area and the second end area, each longitudinal second antenna element of the plurality of longitudinal second antenna elements overlaps with an adjacent first antenna conductor loop of the plurality of first antenna conductor loops.

17. The magnetic resonance system as claimed in claim 16, wherein the first extending surface essentially forms a cylinder outer surface, and the first direction runs along the circumference of a cylinder formed by the cylinder outer surface, so that the plurality of first antenna conductor loops arranged in a row form an annular antenna structure.

18. The magnetic resonance antenna arrangement as claimed in claim 16, wherein two first antenna conductor loops of the plurality of first antenna conductor loops next to one another in a row have a common conductor loop section with a capacitive element.

19. A method of using a magnetic resonance antenna arrangement, the method comprising:

sending out magnetic resonance excitation signals, receiving the magnetic resonance signals, or sending out the magnetic resonance excitation signals and receiving the magnetic resonance signals in a magnetic resonance system comprising the magnetic resonance antenna arrangement, the magnetic resonance antenna arrangement comprising:

at least one first antenna group comprising a plurality of first antenna conductor loops, the plurality of first antenna conductor loops being individually-controllable; and a second antenna group adjacent to the at least one first antenna group, the second antenna group comprising a plurality of longitudinal second antenna elements, the plurality of longitudinal second antenna elements being individually-controllable, wherein the plurality of first antenna conductor loops essentially extend in a first extending surface and are arranged in the first extending surface in a first direction in a row behind one another, wherein the plurality of longitudinal second antenna elements are disposed with longitudinal axes transverse to the first direction in parallel next to one another and extend in a second extending surface that runs essentially in parallel to the first extending surface, wherein the plurality of longitudinal second antenna elements are coupled at a first end area and at a second end area to a conductive element such that each longitudinal second antenna element of the plurality of longitudinal second antenna elements forms a second conductor loop with the conductive element, which is at an angle to the first extending surface, and wherein the plurality of longitudinal second antenna elements are disposed so that, in the first end area, the second end area, or the first end area and the second end area, each longitudinal second antenna element of the plurality of longitudinal second antenna elements overlaps with an adjacent first antenna conductor loop of the plurality of first antenna conductor loops.

* * * * *